United States Patent
Lee et al.

(10) Patent No.: US 7,005,577 B2
(45) Date of Patent: Feb. 28, 2006

(54) SEMICONDUCTOR CHIP PACKAGE HAVING AN ADHESIVE TAPE ATTACHED ON BONDING WIRES

(75) Inventors: Sang-Yeop Lee, Cheonan (KR); Min-Il Kim, Cheonan (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/458,281

(22) Filed: Jun. 11, 2003

(65) Prior Publication Data

US 2004/0050571 A1   Mar. 18, 2004

(30) Foreign Application Priority Data

Sep. 13, 2002   (KR) .................... 10-2002-0055690

(51) Int. Cl.
*H01L 23/28*   (2006.01)
(52) U.S. Cl. .................... 174/52.2; 174/52.4; 257/738; 257/783
(58) Field of Classification Search .............. 174/52.4, 174/52.2; 257/738, 784, 783
See application file for complete search history.

(56) References Cited

U.S. PATENT DOCUMENTS

| | | | |
|---|---|---|---|
| 5,323,060 A * | 6/1994 | Fogal et al. ................. | 257/777 |
| 6,316,727 B1 | 11/2001 | Liu ........................... | 174/52.4 |
| 6,333,562 B1 * | 12/2001 | Lin ............................ | 257/777 |
| 6,388,313 B1 * | 5/2002 | Lee et al. .................... | 257/686 |
| 6,414,384 B1 * | 7/2002 | Lo et al. ..................... | 257/685 |
| 6,545,365 B1 * | 4/2003 | Kondo et al. ............... | 257/777 |
| 6,569,709 B1 * | 5/2003 | Derderian ................... | 438/109 |
| 6,650,019 B1 * | 11/2003 | Glenn et al. ................ | 257/777 |

FOREIGN PATENT DOCUMENTS

| | | |
|---|---|---|
| KR | 2000-003001 | 1/2000 |
| KR | 2000-058742 | 10/2000 |

* cited by examiner

*Primary Examiner*—Hung V. Ngo
(74) *Attorney, Agent, or Firm*—Harness, Dickey & Pierce, P.L.C.

(57) ABSTRACT

The invention provides a semiconductor chip package, and a means of forming such a semiconductor chip package, in which one or more semiconductor chips are electrically connected to a mounting substrate by wire bonding in which an adhesive tape is provided on the active surface of the semiconductor chips for encapsulating at least an upper portion of the bonding wires adjacent the active surfaces to improve the stability of the bonding wires during subsequent processing.

9 Claims, 4 Drawing Sheets

SEMICONDUCTOR CHIP PACKAGE HAVING AN ADHESIVE TAPE ATTACHED ON BONDING WIRES

This U.S. nonprovisional patent application claims priority under 35 U.S.C. § 119 of Korean Patent Application 2002-55690 filed on Sep. 13, 2002, the entire contents of which is hereby incorporated by reference.

BACKGROUND OF THE INVENTION

The present invention relates to a semiconductor device and, more particularly, to a semiconductor chip package in which a semiconductor chip is electrically connected to a substrate by wire bonding. Generally, in forming such a package, a semiconductor chip is attached to a mounting means such as a substrate or lead frame using a liquid adhesive.

FIG. 1 is a cross-sectional view showing an example of a conventional semiconductor chip package assembled with a liquid adhesive. FIG. 2 is a cross-sectional view showing another example of a conventional semiconductor chip package assembled with a liquid adhesive.

As illustrated in FIG. 1, a semiconductor chip package 310 includes a single semiconductor chip 311. The semiconductor chip 311 is attached to a printed circuit board 321 by a layer of liquid adhesive 325. Chip pads 312 are connected to substrate pads 322 by bonding wires 327.

As illustrated in FIG. 2, a semiconductor chip package 410 includes two semiconductor chips in a vertical stack. A first semiconductor chip 411 is attached to a printed circuit board 421 using a layer of liquid adhesive 425. A second semiconductor chip 413 is then attached to the first semiconductor chip 411 by a layer of liquid adhesive 426. Chip pads 412 and 414 and the semiconductor chips are electrically connected to substrate pads 422 by bonding wires 427.

The semiconductor chip packages 310 and 410 are commonly protected from external environments by sealing portions 335 and 435, respectively. The sealing portions 335 and 435 are typically made of an epoxy molding compound (EMC). The sealing portions 335 and 435 seal the semiconductor chips 311, 411 and 413, the bonding wires 327 and 427, and the connection portions of the semiconductor chips and bonding wires. Solder balls 337 and 437 are attached on the bottom surface of the printed circuit boards 321 and 421 and function as external connection terminals.

In the conventional semiconductor chip packages illustrated in FIGS. 1 and 2, the semiconductor chips are attached using a liquid adhesive. The use of liquid adhesive in assembling chip packages may introduce processing complications including the need to maintain a uniform quantity of adhesive to reduce voids under the chip and to reduce adhesive overflows onto the semiconductor chip and substrate. The presence of such defects may degrade the reliability of the final semiconductor product. Further, when a semiconductor chip package is produced by vertically stacking a plurality of semiconductor chips, the liquid adhesive may contaminate the semiconductor chip pads and possibly complicate or degrade the performance of subsequent processes or the reliability of the resulting semiconductor device.

In an effort to address some of the problems associated with liquid adhesives, film-type non-conductive adhesive tape has been used to replace liquid adhesive for mounting semiconductor chips. FIG. 3 is a cross-sectional view of an example of a conventional semiconductor chip package using an adhesive tape for mounting the semiconductor chip.

As illustrated in FIG. 3, a semiconductor chip package 510 includes two semiconductor chips 511 and 513 provided in a vertical stack. A first semiconductor chip 511 is attached to a printed circuit board 521 by a liquid adhesive layer 525. A second semiconductor chip 513 is attached to the first semiconductor chip 511 by a non-conductive adhesive tape 526. The adhesive tape 526 is sized to be located generally within chip pads 512 of the first semiconductor chip 511, and with a thickness that provides a space for the wire loop portion of bonding wires 527b connecting the chip pads 512 to substrate pads 522.

In attaching a semiconductor chip using an adhesive tape, however, misalignment may result in the adhesive tape covering a portion of the chip pads or extending beyond the chip edge so that the wires may not be bonded normally to the chip pads. Furthermore, the empty space remaining between the upper chip and the lower chip at their periphery may compromise the process of attaching bonding wires to the upper chip resulting in poor bonds and/or damaged chips and may result in voids in the EMC.

SUMMARY OF THE INVENTION

Exemplary embodiments of the invention provide semiconductor chip packages having an adhesive tape attached to the bonding wires near the chip pads. A semiconductor chip package manufactured according to an exemplary embodiment of the invention may include a semiconductor chip having an active surface with chip pads formed near the edges of the active surface. The semiconductor chip is typically mounted on a mounting means in such a manner that the active surface of the semiconductor chip faces upwardly with a plurality of bonding wires electrically connecting the semiconductor chip to the mounting means. A non-conductive adhesive tape is attached to the active surface of the semiconductor chip and onto at least a portion of the bonding wires located near the upper portion of the semiconductor chip. A package body may then be used to seal the semiconductor chip, the mounting means, the bonding wires, and the non-conductive adhesive tape.

In another exemplary embodiment, the semiconductor chip package comprises a plurality of semiconductor chips, each of which has an active surface with chip pads formed on the active surface. A first semiconductor chip is mounted on a mounting means, with bonding wires electrically connecting the first semiconductor chip to the mounting means. The first semiconductor chip may be attached to the mounting means by a layer of liquid adhesive. A second semiconductor chip is then attached to the first semiconductor chip using a non-conductive adhesive tape. A second non-conductive adhesive tape is then applied to the active surface of the second semiconductor chip. The resulting chip stack structure has adhesive tape attached to the active surface of each of the semiconductor chips and to an upper portion of the bonding wires located near the active surface of each semiconductor chip.

Preferably, the adhesive tape is larger than the active surface of the semiconductor chip and has a thickness of 5 $\mu$m to 200 $\mu$m. It is also preferable that the adhesive tape comprises a synthetic resin comprising at least one resin selected from polyimide, epoxy, and acryl resins. In addition, the adhesive tape is preferably attached to the entire active surface in a manner that encloses at least the portion of the bonding wires extending over the upper portion of the semiconductor chip.

BRIEF DESCRIPTION OF THE DRAWINGS

Exemplary embodiments of the present invention will become readily apparent by the following detailed description, with reference to the accompanying drawings, in which identified reference numerals designate similar or identical structural elements, and, in where.

DETAILED DESCRIPTION OF THE INVENTION

The invention will now be described more fully with reference to exemplary embodiments and the accompanying drawings. This invention may, however, be embodied in many different forms and should not be construed as limited to the exemplary embodiments set forth herein; rather, these embodiments are provided so that this disclosure will be thorough and complete, and will fully convey the scope of the invention to those skilled in the art.

First Exemplary Embodiment

Figure 1:
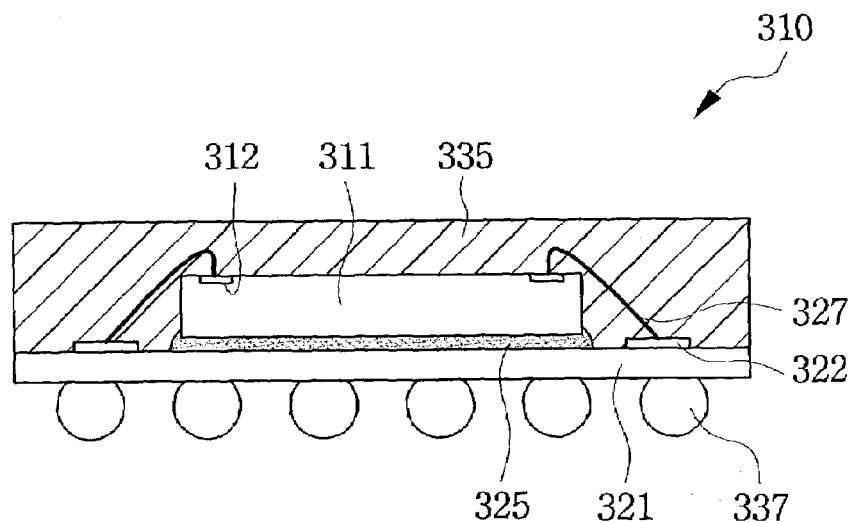
FIG. 1 is a cross-sectional view showing one example of a conventional semiconductor chip package using a liquid adhesive.
Figure 2:
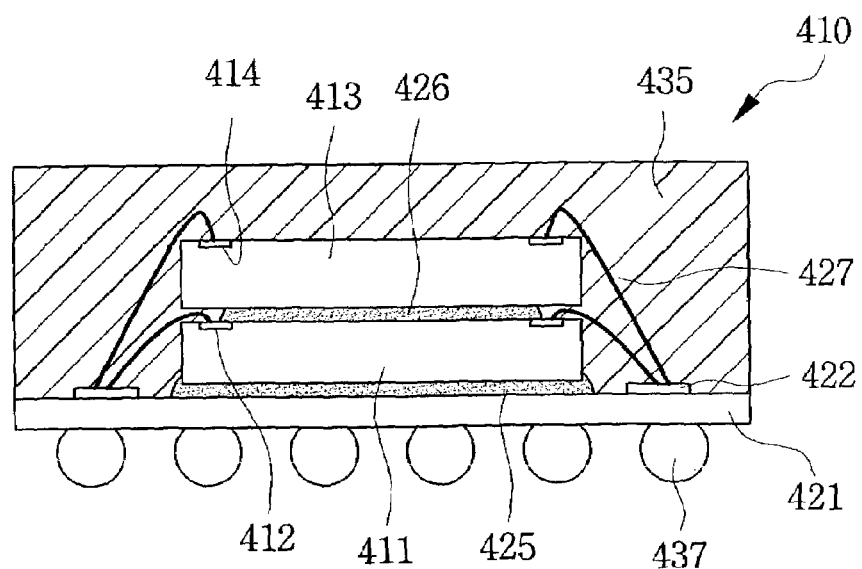
FIG. 2 is a cross-sectional view showing another example of a conventional semiconductor chip package using a liquid adhesive.
Figure 3:
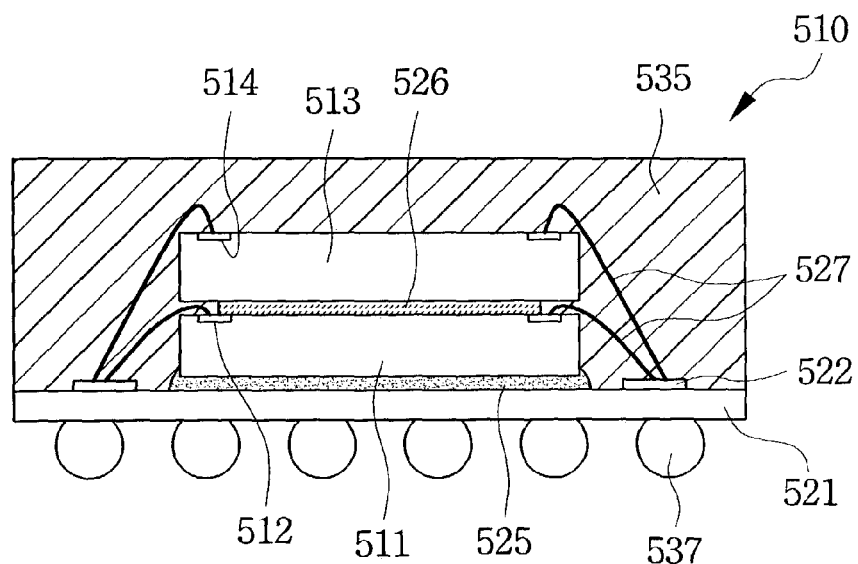
FIG. 3 is a cross-sectional view showing an example of a conventional semiconductor chip package using an adhesive tape.
Figure 4:
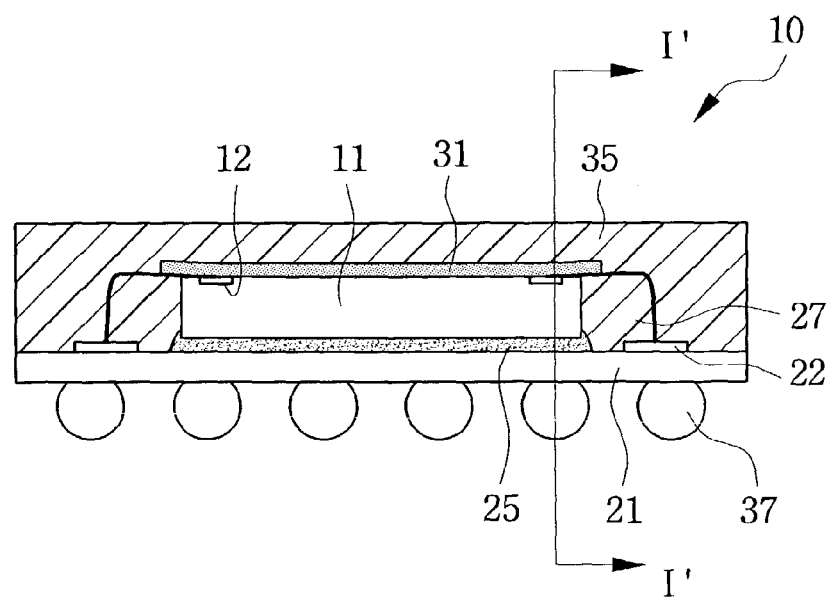
FIG. 4 is a cross-sectional view of a semiconductor chip package in accordance with a first exemplary embodiment of the invention.
Figure 5:
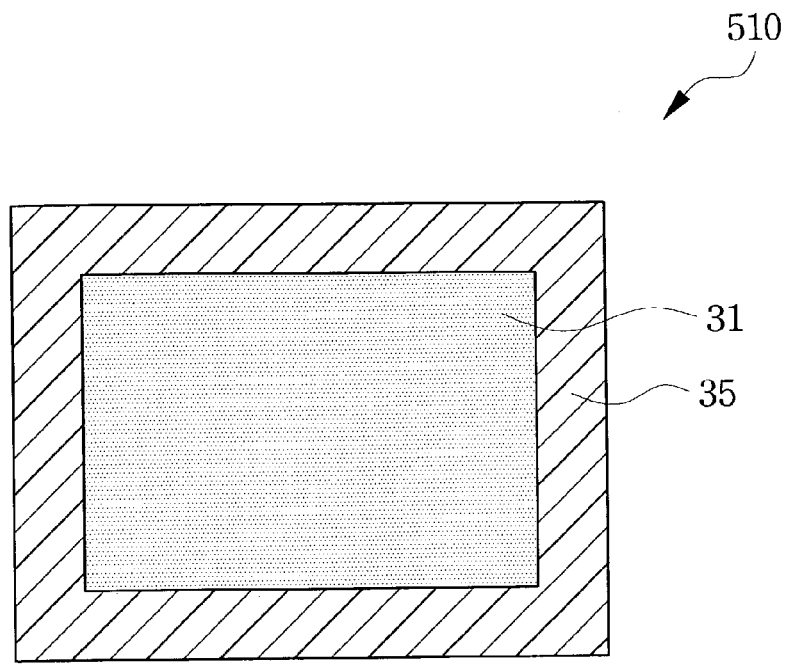
FIG. 5 is a plane view of a semiconductor chip package in accordance with a first exemplary embodiment of the invention.
Figure 6:
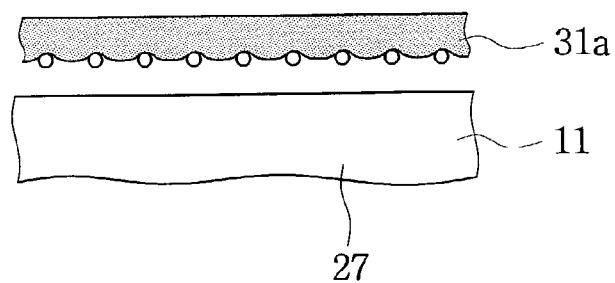
FIGS. 6 and 7 are cross-sectional views along line I'–I" of FIG. 4 illustrating alternative attachments of an adhesive tape to a semiconductor chip package according to the embodiment illustrated in FIG. 4.
Figure 7:
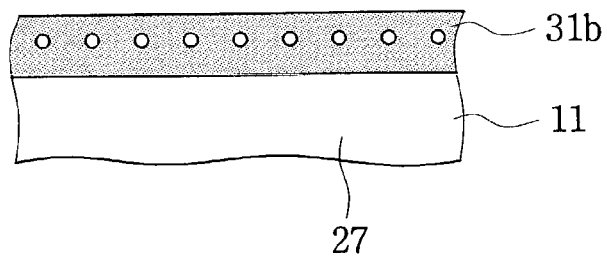

FIG. 4 is a cross-sectional view of a semiconductor chip package in accordance with a first exemplary embodiment of the present invention. FIG. 5 is a plane view of a semiconductor chip package in accordance with a first exemplary embodiment of the present invention and FIGS. 6 and 7 are cross-sectional views illustrating the attachment of an adhesive tape to the semiconductor chip package of FIG. 4.

Referring to FIGS. 4 and 5, a semiconductor chip package 10 includes a semiconductor chip 11 mounted on a printed circuit board 21 using a layer of liquid adhesive 25. Chip pads 12 and substrate pads 22 are electrically connected by bonding wires 27. An adhesive tape 31 comprising a non-conductive synthetic resin is attached to the active surface of the semiconductor chip 11. The semiconductor chip 11, bonding wires 27 and their connection portions are then further protected from the external environment by a sealing portion 35 typically formed from an EMC. Solder balls 37 are provided on the bottom surface of the printed circuit board 21 as external connection terminals.

The non-conductive adhesive tape 31 is preferably sized larger than the active surface of semiconductor chip 11 so as to cover both the upper portion of bonding wires 27 extending over the upper surface of the chip and a predetermined length of bonding wires 27 extending outwardly from the sides of the chip. The adhesive tape 31 preferably has a thickness of about 5 $\mu$m to 200 $\mu$m. If the thickness of the adhesive tape 31 is less than about 5 $\mu$m, handling difficulties may increase while thicknesses in excess of 200 $\mu$m can render the thickness of the whole package excessive.

In this exemplary embodiment, predetermined portions of the bonding wires 27 are generally fixed in place by the adhesive tape 31 and will, therefore, tend to maintain the spacing and orientation relative to adjacent bonding wires 27. Thus, the bonding wires 27 are less likely to experience sagging or sweeping during processing subsequent to the tape bonding process.

The adhesive tape 31 is preferably formed of a material sufficiently soft and thick as to have no damaging effect as it is applied to the bonding wires 27. As shown in FIGS. 6 and 7, the adhesive tape 31a, 31b may initially be attached to the active surface of the semiconductor chip 11 and extend along the upper surfaces of the bonding wires 27. However, depending on the particular adhesive tape composition, tape thickness, the temperature(s) and the heating cycle utilized, the adhesive tape can remain generally attached on the upper surfaces of the bonding wires 27, as illustrated by adhesive tape 31a in FIG. 6, or may exhibit sufficient flow that the adhesive tape can surround the bonding wires 27, as illustrated by adhesive tape 31b in FIG. 7.

The adhesive tape, in the form of sheet, is preferably made of a thermosetting or thermoplastic synthetic resin such as a polyimide, epoxy or acryl resin, or a composite material having at least one synthetic resin as a primary component, which has adhesive properties when heated but which will remain solid at the operating temperatures anticipated for the resulting semiconductor device. Such materials may allow the adhesive tape to be easily attached when heated using one or more convective, conductive or radiating heating means. Adhesive tapes such as Model 1595 from 3M and Polyimide series tapes from Hitachi Chemical Co., Ltd. may be used for this purpose. In general, adhesive tapes that may be utilized in the invention will begin to flow at temperatures between about 100° C. and about 300° C. depending on the particular composition and structure selected. The heating may also be achieved with a thermal-compressing device used for applying the adhesive tape or a heater block in which, or adjacent to which, a tape-attaching apparatus is arranged. During thermal-compressing processes, care should be taken to avoid pressing the adhesive tape too strongly against the inner portion of chip pads or above the bonding wires to reduce the risk of damage to the bonding wires.

The wire bonding may be preferably preformed using stitch bonding of the wire to the chip pads and ball bonding of the wire to the substrate pads. Wire bonding may, however, also utilize ball bonding on the chip pads and stitch bonding on the substrate pads. Although the adhesive tape is preferably larger than the semiconductor chip, the adhesive tape may be almost identical to the size of the semiconductor chip. When the adhesive tape is sized to match the semiconductor chip, the adhesive tape will typically extend over only those portions of the bonding wires that extend over the active surface.

Second Exemplary Embodiment

Figure 8:
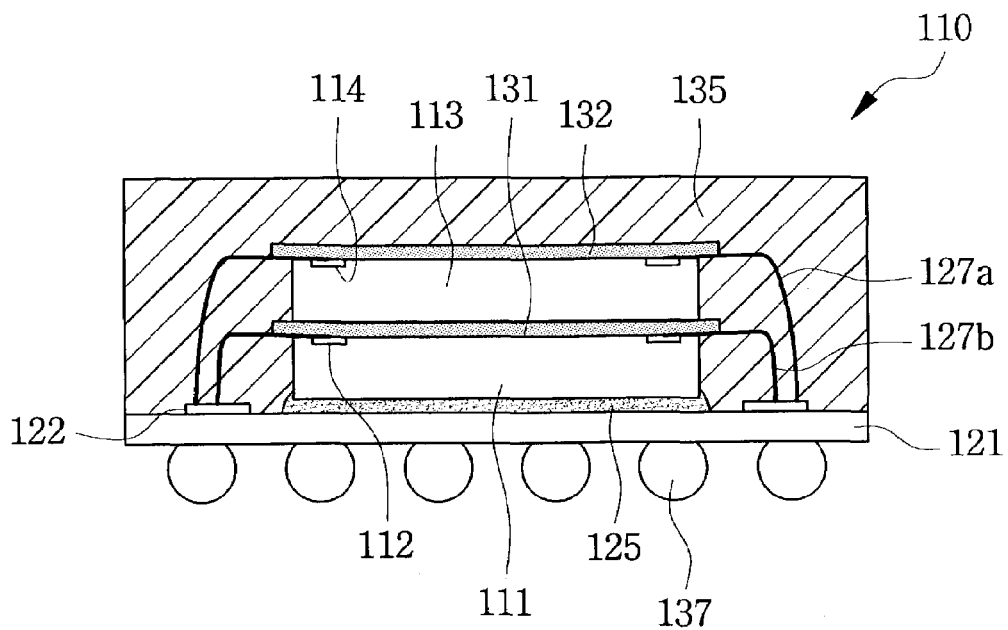
FIG. 8 is a cross-sectional view of a semiconductor chip package in accordance with a second exemplary embodiment of the invention.

FIG. 8 is a cross-sectional view of a semiconductor chip package in accordance with a second exemplary embodiment of the invention. As illustrated in FIG. 8, a semiconductor chip package 110 includes two semiconductor chips 111 and 113 of substantially the same size. The semiconductor chips 111 and 113 form a vertical stack on printed circuit board 121 with each of the semiconductor chips 111 and 113 being electrically connected to the printed circuit board 121 by bonding wires 127b or 127a bonded between chip pads 112 and 114 and substrate pads 122. Solder balls 137 are attached to a surface of the printed circuit board 121 opposite the semiconductor chips and are used as external connection terminals.

A first semiconductor chip 111 is attached to the printed circuit board 121 using a layer of liquid adhesive 125. A second semiconductor chip 113, however, is attached to the first semiconductor chip 111 using an adhesive tape 131. Another adhesive tape 132 is then attached to the active surface of the second semiconductor chip 113. Each of the adhesive tapes 131 and 132 preferably has a thickness of about 5 $\mu$m to 200 $\mu$m and is formed of a non-conductive synthetic resin material. Both of the adhesive tapes 131 and 132 are preferably larger than the respective surfaces of semiconductor chips 111 and 113 to which they are applied. The adhesive tapes 131 and 132 also preferably cover the portion of bonding wires 127b and 127a extending above the active surface and a predetermined length of the bonding wires extending outwardly from the sides of the semiconductor chips 111 and 113.

The two adhesive tapes 131 and 132 may have substantially different compositions or different structures that cause the two adhesive tapes to have different thermal characteristics. For example, using two different adhesive tapes that begin to flow at different temperatures may allow an increased degree of control in the chip mounting process. If the first adhesive tape 131 has a flow temperature that is higher than the flow temperature of the second adhesive tape 132, the attachment to or encapsulation of the lower bonding wires 127b by the first adhesive tape can be completed before attaching the second adhesive tape. The second adhesive tape 132 can then be applied to the upper surface of the second semiconductor chip 113 and heated to a temperature sufficient to cause the second adhesive tape to attach to or encapsulate the upper bonding wires 127a without causing additional flow within the first adhesive tape 131. Conversely, the two adhesive tapes may be selected to have substantially identical thermal behavior so that a single thermal treatment performed after both the first adhesive tape 131 and the second adhesive tape 132 are in place will cause the adhesive tapes to attach to or encompass the respective bonding wires 127b, 127a substantially simultaneously.

In this exemplary embodiment, no significant empty space or voids are present between the upper semiconductor chip 113 and the lower semiconductor chip 111. The adhesive tapes can support and resist the forces generated by a bonding tool during a wire-bonding process after attaching the upper semiconductor chip. Thus, the connection state of the bonding wires is generally more consistent and the likelihood of bonding failures can be reduced. Moreover, by using an adhesive tape on the upper semiconductor chip, even though the length of bonding wires is increased due to the stacking of chips, the tendency of the bonding wires to sag or sweep can be reduced. In addition, by using an adhesive tape that is larger than the active surface of the lower semiconductor chip, interference between bonding wires coupled to the upper chip and the lower chip, respectively, can be reduced.

Third Exemplary Embodiment

Figure 9:
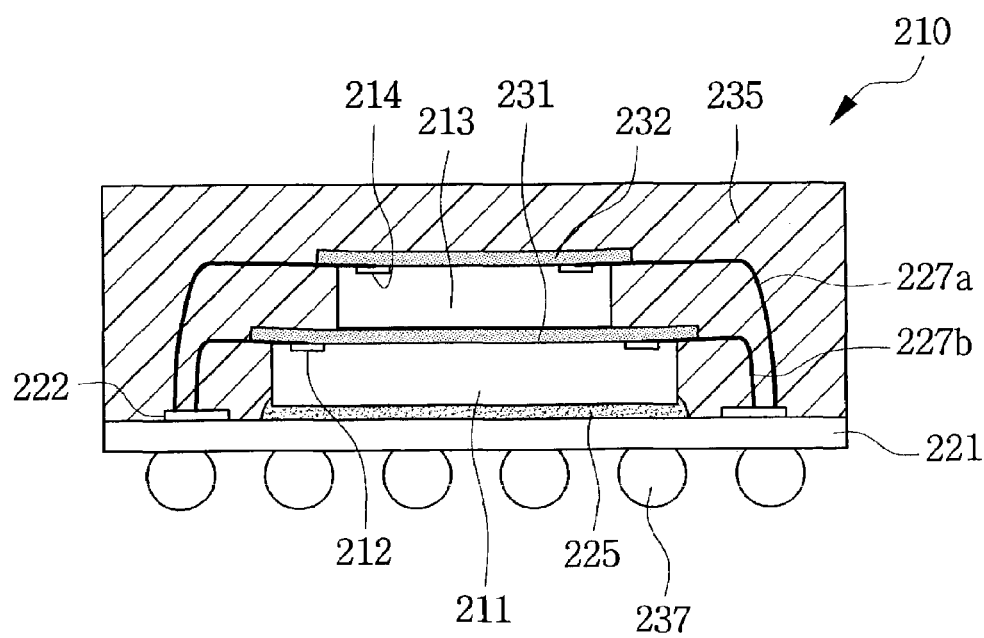
FIG. 9 is a cross-sectional view of a semiconductor chip package in accordance with a third exemplary embodiment of the invention.

FIG. 9 is a cross-sectional view of a semiconductor chip package in accordance with a third exemplary embodiment of the invention. As illustrated in FIG. 9, a semiconductor chip package 210 includes two semiconductor chips 211 and 213 of different size. The semiconductor chips 211 and 213 form a vertical stack on printed circuit board 221, with the first semiconductor chip 211 being attached to the printed circuit board 221 with a layer of liquid adhesive 225. A smaller second semiconductor chip 213 is then attached to the first semiconductor chip 211 using an adhesive tape 231. The semiconductor chips 211 and 213 are electrically connected to the printed circuit board contacts 222 by bonding wires 227b and 227a and solder balls 137 are provided on a surface of the printed circuit board 221 opposite the semiconductor chips for use as external connection terminals.

According to the exemplary embodiments of the invention, a semiconductor chip package may be formed using stacked semiconductor chips of the same size or semiconductor chips having different sizes. When the stacked semiconductor chip package includes chips of different sizes, it is preferred that the upper semiconductor chip is smaller than the lower semiconductor chip.

Although the exemplary embodiments show a printed circuit board used as the mounting means, a film type tape circuit board or conventional lead frames may also be used as mounting means. Also, although the adhesive tape is preferably larger than the active surface of the semiconductor chip to which it is attached, the adhesive tape may be substantially the same size or slightly smaller than the active area of the semiconductor chip to which it is attached. Further, although in the described exemplary embodiments the initial attachment of the first or sole semiconductor chip to the substrate used a liquid adhesive, an adhesive tape could be used to provide the initial attachment. Although exemplary embodiments have been illustrated with semiconductor chip packages having two semiconductor chips, the invention is equally applicable to semiconductor chip packages including stacks of more than two semiconductor chips.

It should be understood that this invention is not to be limited to the exemplary embodiments and examples described above, and that numerous modifications and variations can be made by those skilled in the art without departing from the spirit and scope of this invention.

What is claimed is:

1. A semiconductor chip package comprising:
 a first semiconductor chip having a first surface and an active surface opposite the first surface;
 chip pads arrayed within a perimeter of the active surface;
 a mounting substrate having a mounting region to which the first surface of the semiconductor chip is affixed and a plurality of mount pads arrayed on the mounting substrate;
 first plurality of bonding wires providing electrical connection between chip pads and mount pads, upper portions of the first plurality of bonding wires extending from the chip pads and above and across a peripheral region of the active surface; and
 a first adhesive tape attached directly to the active surface of the first semiconductor chip and substantially encapsulating the upper portions of the first plurality of bonding wires; wherein
 the first adhesive tape extends beyond a portion of the perimeter of the active surface of the first semiconductor chip.

2. The semiconductor chip package according to claim 1, further comprising:
 a polymeric composition substantially encapsulating the first semiconductor chip, the first plurality of bonding wires and the first adhesive tape.

3. The semiconductor chip package according to claim 1, wherein
the mounting substrate is selected from a group consisting of printed circuit boards, lead frames and tape type circuit boards.

4. The semiconductor chip package according to claim 1, wherein
the first adhesive tape extends beyond the entire perimeter of the active surface of the first semiconductor chip.

5. The semiconductor chip package according to claim 1, wherein
the first adhesive tape has a thickness of between about 5 $\mu$m to 200 $\mu$m.

6. The semiconductor chip package according to claim 1, wherein
the first adhesive tape includes a major portion of a thermosetting or thermoplastic synthetic resin material.

7. The semiconductor chip package according to claim 6, wherein
the synthetic resin material includes a major portion of at least one material selected from a group of resins consisting of polyimide, epoxy and acryl resins.

8. A semiconductor chip package comprising:
a first semiconductor chip having a first surface and an active surface opposite the first surface;
chip pads arrayed within a perimeter of the active surface;
a substrate having a mounting region to which the first surface of the semiconductor chip is affixed and a plurality of mount pads arrayed on the mounting substrate;
first plurality of bonding wires extending from the chip pads and above and across a peripheral region of the active surface; and
a first adhesive tape; wherein the semiconductor chip package is produced by
attaching the first semiconductor chip having a first surface and an active surface opposite the first surface on a mounting substrate;
attaching the first plurality of bonding wires between chip pads arrayed within a perimeter of the active surface of the first semiconductor chip and mount pads arrayed on the mounting substrate, the first plurality of bonding wires establishing electrical connections between the first semiconductor chip and the mounting substrate;
attaching the first adhesive tape directly to the active surface of the first semiconductor chip and to upper portions of the first plurality of bonding wires; and
encapsulating the upper portions of the bonding wires within portions of the first adhesive tape wherein
the first adhesive tape extends beyond a portion of the perimeter of the active surface of the first semiconductor chip.

9. The semiconductor package according to claim 8, further comprising,
heating the first adhesive tape to a temperature sufficient to cause the portions of the first adhesive tape to encapsulate the upper portions of the bonding wires.

* * * * *